(12) United States Patent
Chou

(10) Patent No.: US 10,768,526 B2
(45) Date of Patent: *Sep. 8, 2020

(54) METHOD OF FORMING PATTERNS

(71) Applicant: Micron Technology, Inc., Boise, ID (US)

(72) Inventor: Kuo-Yao Chou, Taichung (TW)

(73) Assignee: Micron Technology, Inc., Boise, ID (US)

(\*) Notice: Subject to any disclaimer, the term of this patent is extended or adjusted under 35 U.S.C. 154(b) by 99 days.

This patent is subject to a terminal disclaimer.

(21) Appl. No.: 16/111,522

(22) Filed: Aug. 24, 2018

(65) Prior Publication Data

US 2018/0364567 A1 Dec. 20, 2018

Related U.S. Application Data

(63) Continuation of application No. 15/060,609, filed on Mar. 4, 2016, now Pat. No. 10,073,342.

(51) Int. Cl.
*G03F 7/40* (2006.01)
*G03F 7/00* (2006.01)
(Continued)

(52) U.S. Cl.
CPC ............. *G03F 7/0035* (2013.01); *G03F 7/16* (2013.01); *G03F 7/40* (2013.01); *H01L 21/0206* (2013.01);
(Continued)

(58) Field of Classification Search
CPC ................................. G03F 7/0035; G03F 7/40
See application file for complete search history.

(56) References Cited

U.S. PATENT DOCUMENTS 10,073,342 B2\* 9/2018 Chou .................. H01L 21/0332
2011/0151668 A1 6/2011 Tang et al.
(Continued)

FOREIGN PATENT DOCUMENTS

CN 1505101 A 6/2004
CN 102655208 B 11/2014

OTHER PUBLICATIONS

Taiwanese Search Report and Office Action from Taiwanese Application No. 105110842, dated Feb. 26, 2017, 9 pages with English translation.

*Primary Examiner* — Kathleen Duda
(74) *Attorney, Agent, or Firm* — TraskBritt

(57) ABSTRACT

A substrate having a target material layer is provided. A first hard mask layer, a second hard mask layer, and a photoresist layer are formed on the target material layer. The photoresist layer is transferred into first patterns on the second hard mask layer. Regions of the second hard mask layer not protected by the first patterns are etched away, thereby forming second patterns. The first patterns are trimmed to form trimmed features. A conformal spacer material layer is deposited on the trimmed features, the second patterns, and the first hard mask. The spacer material layer is etched to form first spacers on sidewalls of the trimmed features, and second spacers on sidewalls of the second patterns. The trimmed features are removed. Regions of the second patterns not protected by the first spacers are removed, thereby forming patterns with a reduced, fine pitch.

20 Claims, 5 Drawing Sheets

(51) Int. Cl.
  *G03F 7/16* (2006.01)
  *H01L 21/02* (2006.01)
  *H01L 21/027* (2006.01)
  *H01L 21/033* (2006.01)
  *H01L 21/311* (2006.01)
  *H01L 21/3213* (2006.01)
(52) U.S. Cl.
  CPC .... *H01L 21/0273* (2013.01); *H01L 21/02164* (2013.01); *H01L 21/0332* (2013.01); *H01L 21/0337* (2013.01); *H01L 21/31116* (2013.01); *H01L 21/31138* (2013.01); *H01L 21/31144* (2013.01); *H01L 21/32139* (2013.01)

(56) References Cited

U.S. PATENT DOCUMENTS

| | | |
|---|---|---|
| 2013/0065397 A1 | 3/2013 | Chen |
| 2013/0316537 A1 | 11/2013 | Chen et al. |
| 2015/0255283 A1 | 9/2015 | Lee et al. |

\* cited by examiner

METHOD OF FORMING PATTERNS

CROSS-REFERENCE TO RELATED APPLICATION

This application is a continuation of U.S. patent application Ser. No. 15/060,609, filed Mar. 4, 2016, now U.S. Pat. No. 10,073,342, issued Sep. 11, 2018, the disclosure of which is hereby incorporated herein in its entirety by this reference.

TECHNICAL FIELD

The present invention relates generally to the manufacture of semiconductor devices. More specifically, this invention relates to a method of forming patterns with reduced, fine pitches.

BACKGROUND

With the prosperous growth of electrical products consumption, the current trend of consumers' demand, including increased portability, computing power, memory capacity and energy efficiency, is for the dimension of such products to almost always be toward small size and delicacy design.

The continual reduction in feature sizes results in greater demands on the techniques used to form the critical features in the integrated circuits. For example, lithography is commonly used to pattern these features. Because lithography is typically accomplished by projecting light or radiation onto a surface, the ultimate resolution of a particular lithographic technique depends upon factors such as optics and light or radiation wavelength.

In many applications it is advantageous to have features such as lines and spaces to be as small as possible. Smaller line widths or periods translate into higher performance and/or higher density circuits. Hence, the microelectronics industry is on a continual quest to reduce the minimum resolution in photolithography systems and thereby reduce the line widths or periods on patterned substrates.

There exists a need for a method of fabricating sub-lithographic sized line and space patterns that utilizes conventional lithography systems to fabricate the sub-lithographic sized line and space patterns with a feature size that is less than the lithography limit of the lithography system.

BRIEF SUMMARY

The present disclosure is directed to provide an improved method of forming patterns that is capable of overcoming the limitation of the present optical lithography technique and increasing the pattern resolution of the semiconductor manufacturing process.

In one aspect of the disclosure, a method of forming patterns is disclosed. A substrate having thereon a target material layer is provided. A first hard mask layer, a second hard mask layer, and a photoresist layer are formed on the target material layer. The photoresist layer is transferred into first patterns on the second hard mask layer. Regions of the second hard mask layer that are not protected by the first patterns are etched away, thereby forming second patterns that substantially conform to and align with the first patterns. A resist trimming process is performed to trim only the first patterns on the second patterns to thereby form trimmed features. A conformal spacer material layer is deposited on the trimmed features, the second patterns, and on the first hard mask. The spacer material layer is etched to form a plurality of first spacers on the sidewalls of the trimmed features, and a plurality of second spacers on the sidewalls of the second patterns. The trimmed features are removed. An anisotropic dry etching process is performed to etch regions of the second patterns that are not protected by the first spacers, thereby forming a plurality of patterns with a reduced, fine pitch $P_2$ that is about one-quarter of the pitch $P_1$.

These and other objectives of the present invention will no doubt become obvious to those of ordinary skill in the art after reading the following detailed description of the preferred embodiment that is illustrated in the drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
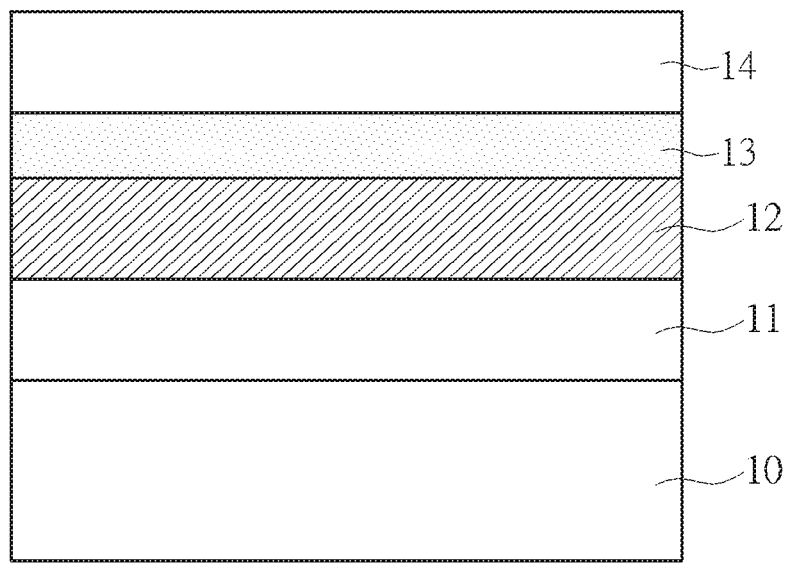
FIG. 1 through FIG. 10 are diagrams illustrating an exemplary method for forming patterns having a reduced, fine pitch according to one embodiment of the invention.

It should be noted that all the figures are diagrammatic. Relative dimensions and proportions of parts of the drawings are exaggerated or reduced in size, for the sake of clarity and convenience. The same reference numerals are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale.

The term "substrate" as used herein includes any structure having an exposed surface onto which a layer is deposited according to the present invention, for example, to form the integrated circuit ("IC") structure. The term "substrate" is understood to include semiconductor wafers. The term "substrate" is also used to refer to semiconductor structures during processing, and may include other layers that have been fabricated thereupon. The term "substrate" includes doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of the substrate, regardless of its orientation. The term "vertical" refers to a direction perpendicular to the horizontal plane as just defined. Terms, such as "on," "above," and "under," are defined with respect to the horizontal plane.

The term "critical dimension" or "CD" is typically the smallest geometrical feature, such as the width of an interconnect line, contact, or trench, that is formed during IC manufacturing using a given technology.

The term "pitch doubling" or "pitch multiplication" refers generally to a method for extending the capabilities of photolithographic techniques beyond their minimum pitch. The concept of pitch can be used to describe the sizes of the critical circuit features, such as conductive lines. Pitch is defined as the distance between identical points in two neighboring features.

These features are typically defined by spaces between adjacent features, which spaces are typically filled by a material, such as an insulator. As a result, pitch can be viewed as the sum of the width of a feature and of the width of the space on one side of the feature separating that feature from a neighboring feature. Conventionally, "multiplication" of pitch by a certain factor actually involves reducing the pitch by that factor. The conventional terminology is retained herein.

The present invention pertains to a pitch multiplication method involving only one photolithographic step and a resist trimming process to define the critical dimension, followed by a self-aligned spacer formation to achieve pitch multiplication.

FIG. 1 through FIG. 10 are diagrams illustrating an exemplary method for forming patterns having a reduced, fine pitch according to one embodiment of the invention. As shown in FIG. 1, a substrate 10 is provided. According to one embodiment, the substrate 10 may be a semiconductor substrate such as a silicon substrate, a silicon germanium (SiGe) substrate, a silicon-on-insulator (SOI) substrate, an epitaxial silicon substrate, or the like. A target material layer 11 is disposed on a main surface of the substrate 10. According to one embodiment, the target material layer 11 may be a dielectric layer, a polysilicon layer or a metal layer, but is not limited thereto. It is one object of the invention to form fine-pitch patterns in the target material layer 11.

According to one embodiment, a first hard mask layer 12 is disposed on the target material layer 11. A second hard mask layer 13 is disposed on the first hard mask layer 12. The first hard mask layer 12 may comprise polysilicon, silicon oxide, silicon nitride, or carbon-containing materials, but is not limited thereto. In some embodiments, the first hard mask layer 12 may comprise metals. The second hard mask layer 13 may comprise a resist material having high etching selectivity with respect to the first hard mask layer 12.

For example, the second hard mask layer 13 may include, but not limited to, a spin-on polymer material commercially available from Shin-Etsu Chemical Company, Ltd. (6-1 Ohtemachi 2-chome, Chiyoda-ku, Tokyo 100-0004, Japan), such as the ODL series, i.e., ODL301. The second hard mask layer 13 may provide additional etch resistance during subsequent pattern transfer in an etching process.

According to one embodiment, a photoresist layer 14 is disposed on the second hard mask layer 13. For example, the photoresist layer 14 may comprise a radiation sensitive silicon-containing resist such as I-line resist, but is not limited thereto. The photoresist layer 14 may comprise a variety of photoresist chemicals suitable for lithographic applications. The photoresist layer 14 is selected to have photochemical reactions in response to electromagnetic radiation emitted from a predetermined light source. The photoresist layer 14 may be a chemically amplified, positive or negative tone, or organic-based photoresist. According to one embodiment, the photoresist layer 14 has high etching selectivity with respect to the second hard mask layer 13.

Figure 2:
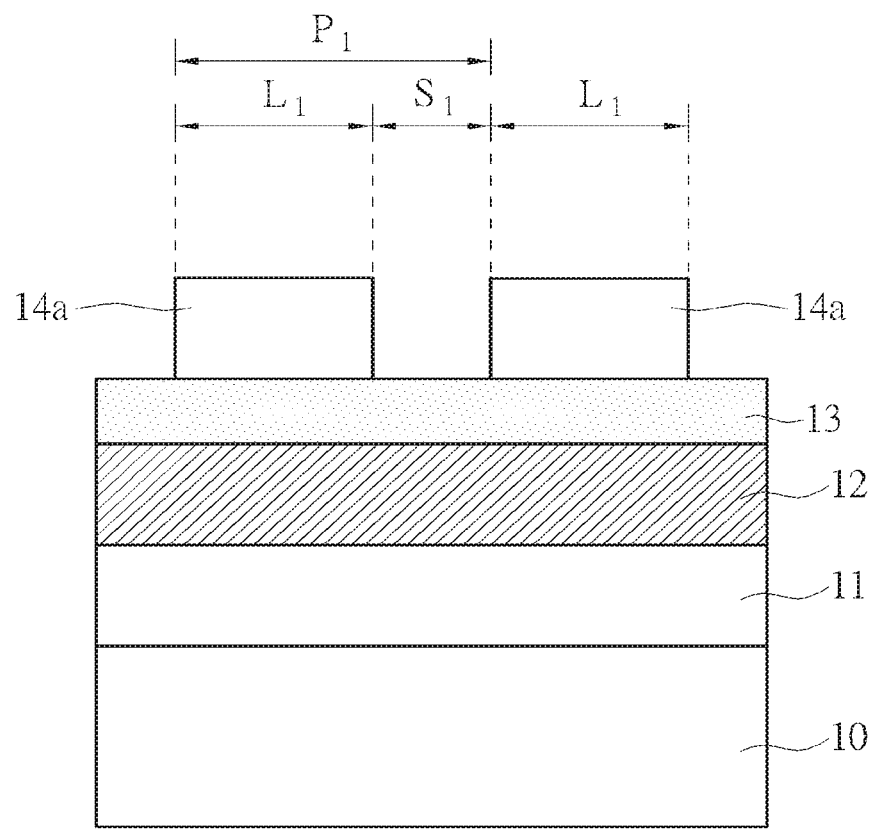

As shown in FIG. 2, a lithographic process is carried out to form first patterns 14a, such as line-shaped patterns on the second hard mask layer 13. The aforesaid lithographic process typically involves exposure to UV/DUV (ultraviolet/deep ultraviolet) light, followed by subsequent baking, inducing a photochemical reaction which changes the solubility of the exposed regions of the photoresist layer 14. Thereafter, an appropriate developer, typically an aqueous base solution, is used to selectively remove the photoresist layer 14 in the exposed regions (for positive-tone resists).

At this point, the first patterns 14a have a first pitch $P_1$, which is the combination of the line width $L_1$ of each first pattern 14a and the space $S_1$ between two adjacent first patterns 14a. According to one embodiment, $L_1 : S_1 = 5:3$.

Figure 3:
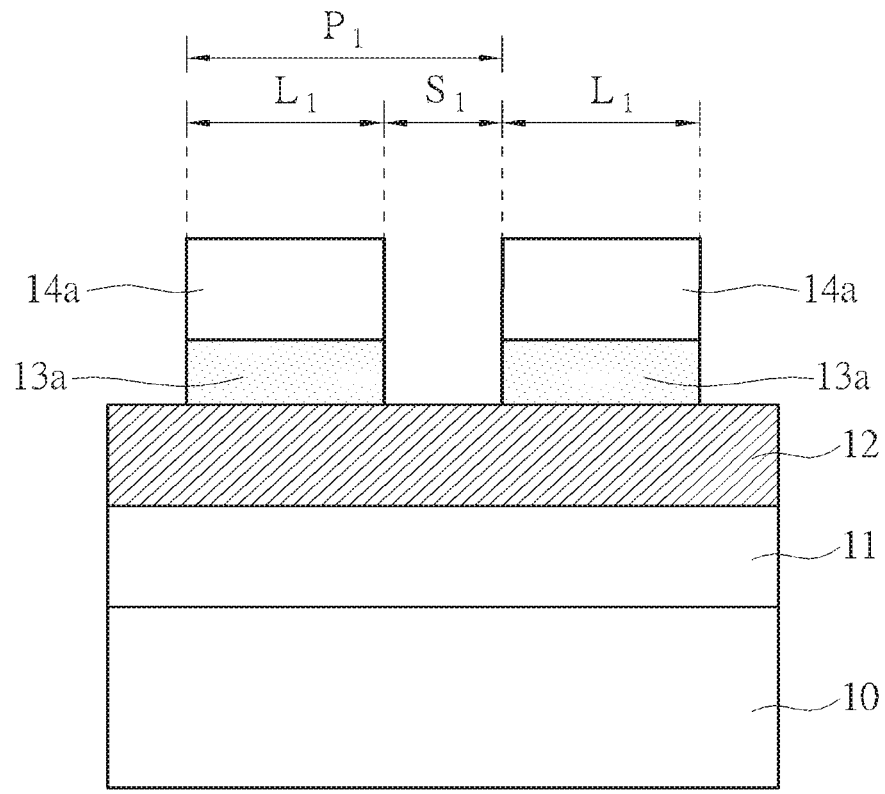

As shown in FIG. 3, an anisotropic dry etching process is then performed to etch away the regions of the second hard mask layer 13 that are not protected by the first patterns 14a, thereby forming second patterns 13a that substantially conform to and align with the first patterns 14a. At this point, the underlying first hard mask layer 12 is substantially intact due to high etching selectivity to the second hard mask layer 13.

Figure 4:
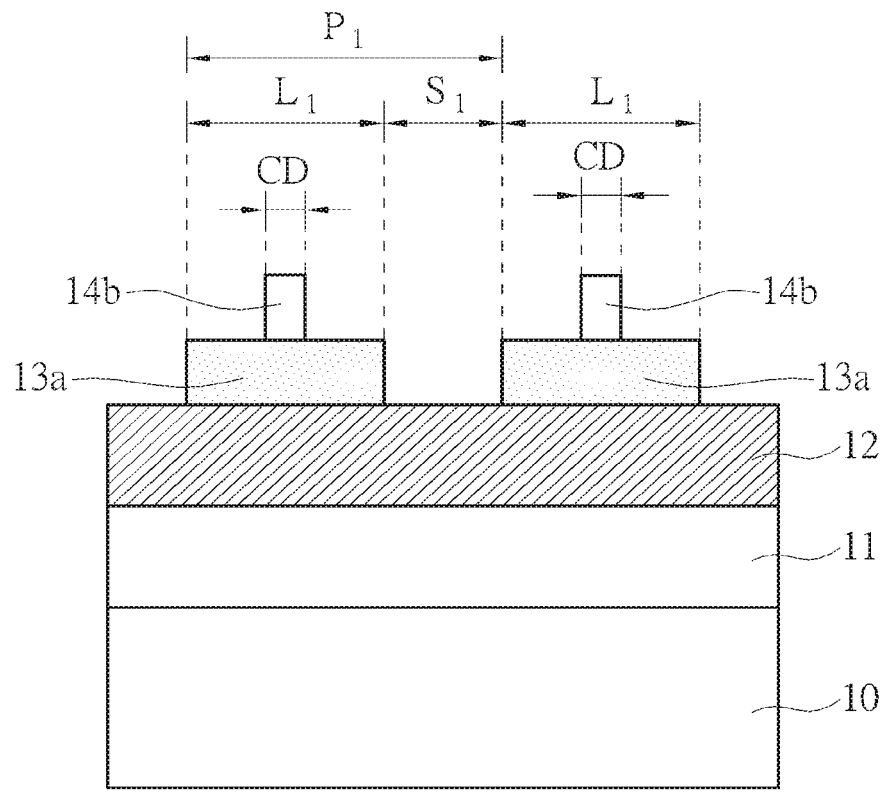

As shown in FIG. 4, a resist trimming process is performed to trim only the first patterns 14a on the second patterns 13a to thereby form trimmed features 14b. The resist trimming step may be a plasma etching step. The first patterns 14a are exposed to a plasma etchant to trim or reduce the dimensions of features patterned on the second patterns 13a. The plasma etchant may comprise a variety of plasma etch chemistries, such as, $O_2$, $HBr/O_2$, $Cl_2/O_2$, $N_2/He/O_2$, or $N_2/O_2$, but is not limited thereto. The trimmed features 14b have a lateral dimension or critical dimension (CD).

Figure 5:
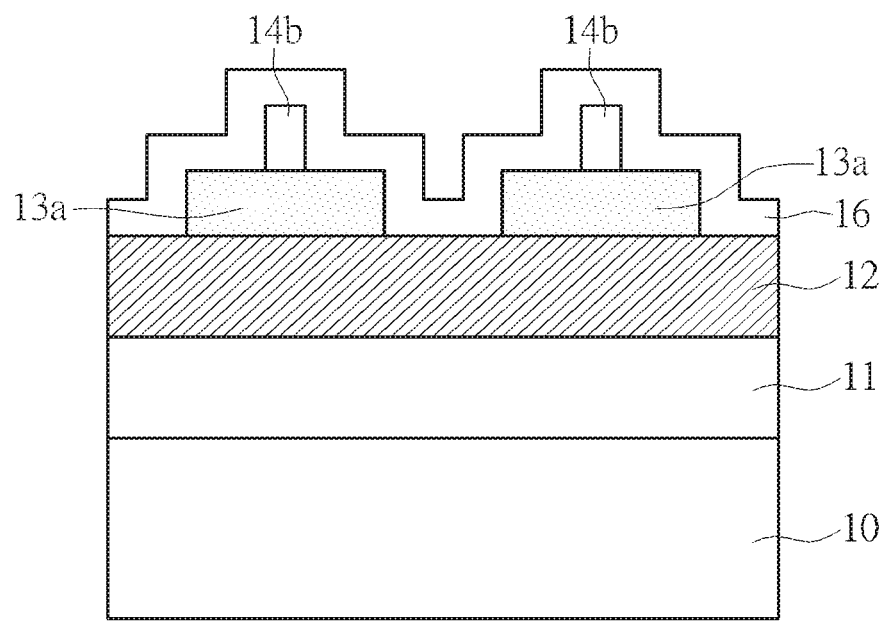

As shown in FIG. 5, a spacer material layer 16 is conformally deposited on the top surfaces and sidewalls of the trimmed features 14b, on the top surfaces and sidewalls of the second patterns 13a, and on the exposed top surface of the first hard mask layer 12. According to one embodiment, the spacer material layer 16 may be a silicon oxide layer and may be deposited by using a chemical vapor deposition (CVD) or atomic layer deposition (ALD) method. However, it is understood that other spacer materials may be employed.

Figure 6:
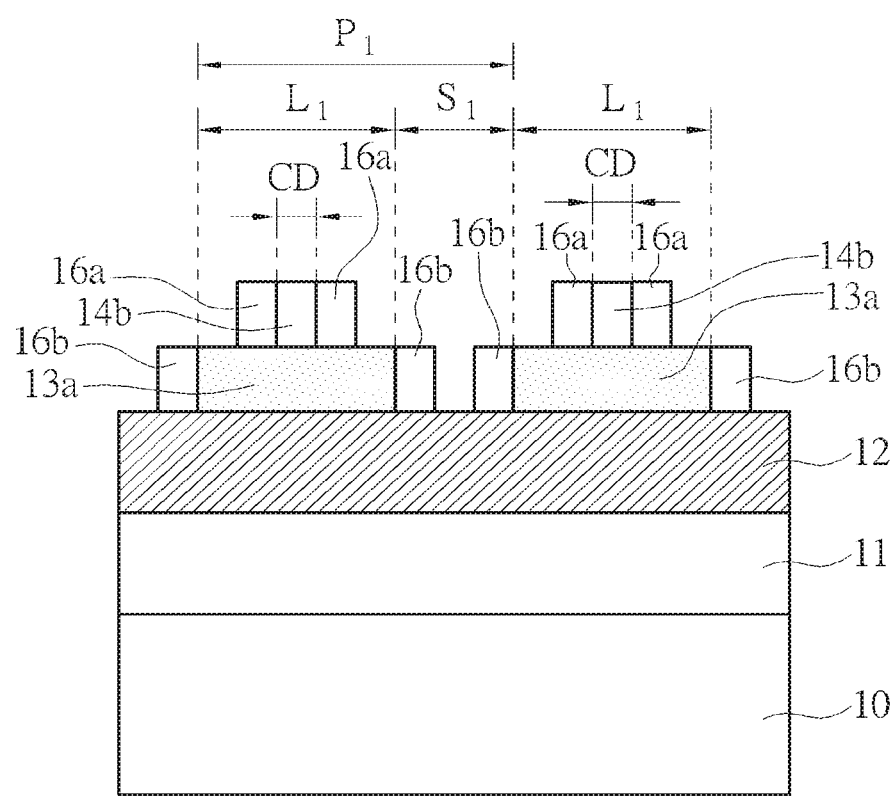

As shown in FIG. 6, the spacer material layer 16 is anisotropically etched to form a plurality of spacers 16a on the sidewalls of the trimmed features 14b, and a plurality of spacers 16b on the sidewalls of the second patterns 13a in a self-aligned fashion.

Figure 7:
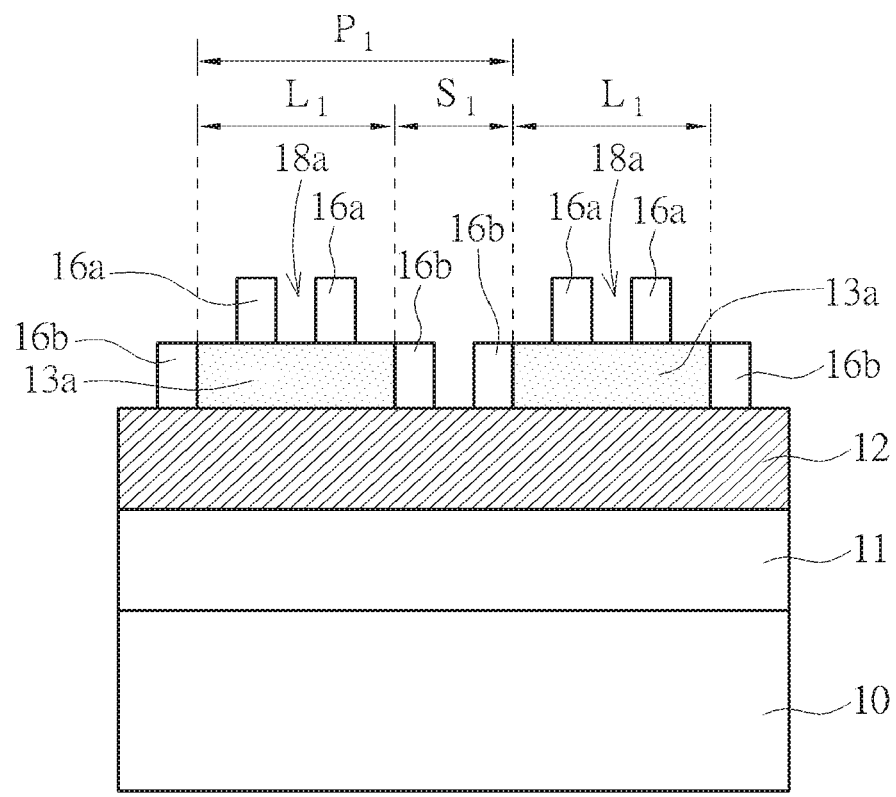

Subsequently, as shown in FIG. 7, the trimmed features 14b are selectively removed, leaving the spacers 16a, the spacers 16b, and the second patterns 13a intact. The removal of the trimmed features 14b may involve the use of a conventional wet cleaning method (e.g., diluted HF solution) or conventional photoresist removing methods, but is not limited thereto. After removing the trimmed features 14b, a gap 18a is formed between two adjacent spacers 16a on each of the second patterns 13a. The dimension of the gap 18a is substantially equal to the critical dimension of the removed trimmed features 14b.

Figure 8:
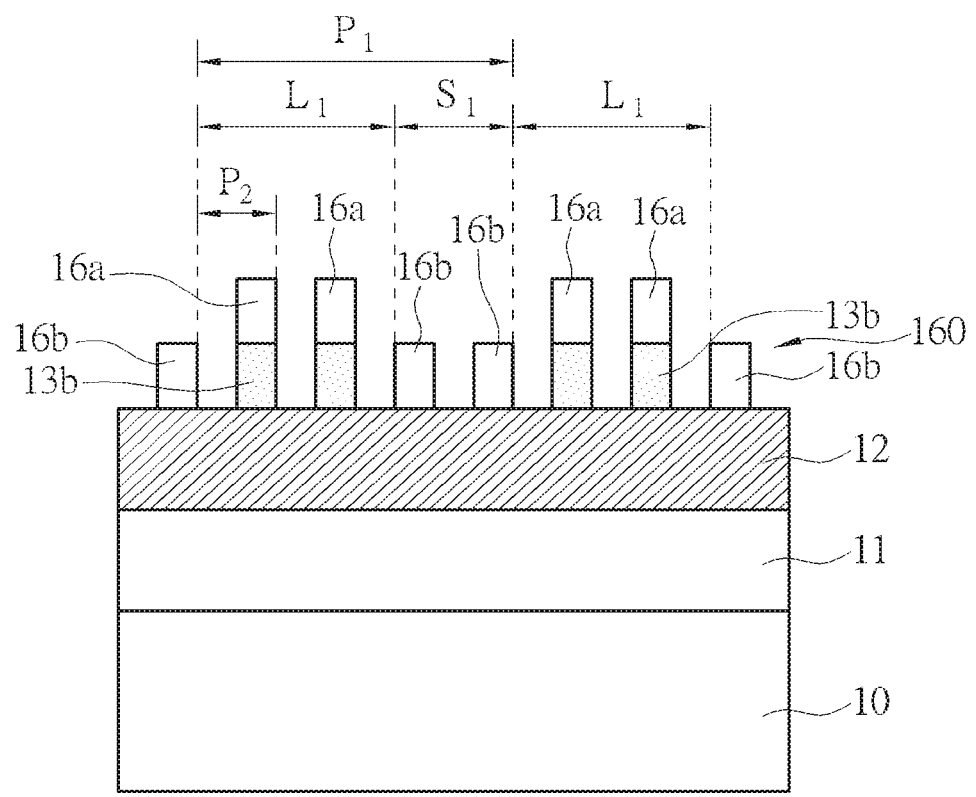

As shown in FIG. 8, using the spacers 16a on the second patterns 13a as a mask, an anisotropic dry etching process is performed to etch the regions of the second patterns 13a that are not protected by the spacers 16a, thereby forming a plurality of patterns 160 with a reduced, fine pitch $P_2$ that is about one-quarter of the pitch $P_1$. The remaining second patterns 13b are situated directly under the spacers 16a, respectively. According to one embodiment, the plurality of patterns 160 may be dense line-shaped patterns with equal lines and spaces.

Figure 9:
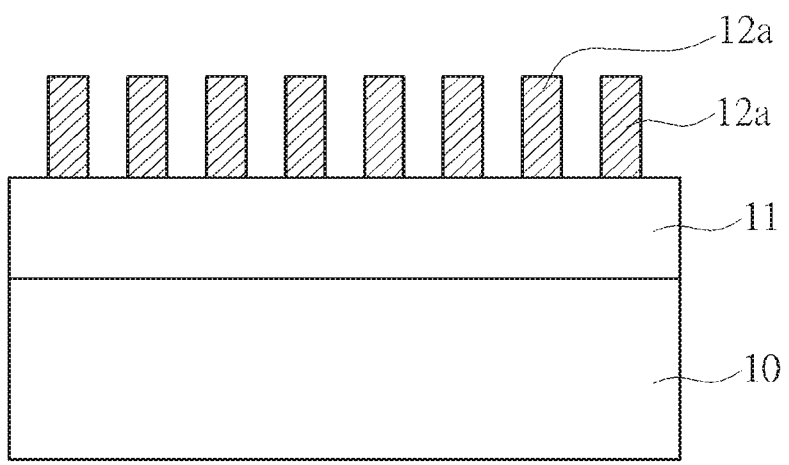

Subsequently, as shown in FIG. 9, using the plurality of patterns 160 with the reduced, fine pitch $P_2$ as a hard mask, an anisotropic dry etching process is then performed to transfer the patterns 160 into the first hard mask layer 12, thereby forming hard mask patterns 12a having the reduced, fine pitch $P_2$.

Figure 10:
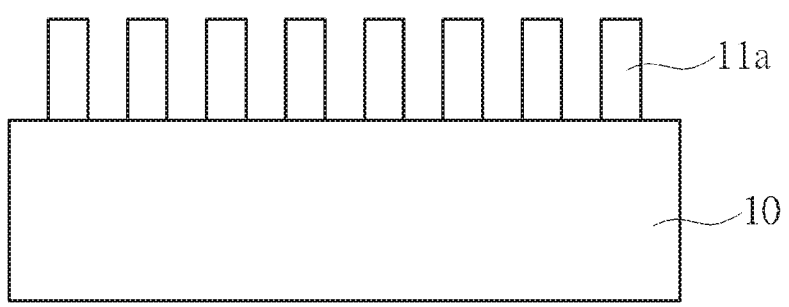

Finally, as shown in FIG. 10, using the hard mask patterns 12a with the reduced, fine pitch $P_2$ as an etching hard mask, an anisotropic dry etching process is then performed to transfer the hard mask patterns 12a into the underlying target material layer 11, thereby forming target patterns 11a having the reduced, fine pitch $P_2$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of patterning a target material, comprising:
   forming a first pattern and a second pattern over a hard mask material on a target material, the first pattern overlying the second pattern;
   laterally removing a portion of the first pattern without laterally removing a portion of the second pattern to form trimmed features on the second pattern;
   forming first spacers on sidewalls of the trimmed features and second spacers on sidewalls of the second pattern;
   removing the trimmed features to expose the second pattern;
   removing exposed portions of the second pattern between the first spacers and the second spacers to form a spacer pattern;
   removing exposed portions of the hard mask material between the spacer pattern to form a hard mask pattern; and
   removing exposed portions of the target material between the hard mask pattern to form a target material pattern.

2. The method of claim 1, wherein forming a first pattern and a second pattern over a hard mask material comprises forming the first pattern and the second pattern in materials selectively etchable relative to one another.

3. The method of claim 1, wherein forming a first pattern and a second pattern over a hard mask material comprises forming the first pattern and the second pattern comprising equally-spaced lines.

4. The method of claim 1, wherein forming a first pattern and a second pattern over a hard mask material comprises forming the first pattern in a photoresist material and forming the second pattern in a spin-on polymer material.

5. The method of claim 1, wherein forming a first pattern and a second pattern over a hard mask material comprises aligning the first pattern over the second pattern.

6. The method of claim 1, wherein forming a first pattern and a second pattern over a hard mask material comprises forming the first pattern and the second pattern at a first pitch.

7. The method of claim 6, wherein removing exposed portions of the target material to form a target material pattern comprises forming the target material pattern at a second pitch, the second pitch equal to about one-quarter of the first pitch.

8. A method of patterning a target material, comprising:
   forming a first photoresist pattern over a first hard mask material on a target material, the first photoresist pattern comprising a pitch;
   forming a second hard mask pattern on the first hard mask material, the second hard mask pattern comprising a second hard mask material;
   laterally removing a portion of the first photoresist pattern without laterally removing a portion of the second hard mask pattern to form trimmed photoresist features on the second hard mask pattern;
   forming a spacer material over the trimmed photoresist features, the second hard mask pattern, and the first hard mask material;
   removing a portion of the spacer material to form first spacers on sidewalls of the trimmed photoresist features and second spacers on sidewalls of the second hard mask pattern;
   removing the trimmed photoresist features;
   removing the second hard mask material exposed between the first spacers and the second spacers to form a spacer material pattern; and
   removing the first hard mask material exposed between the spacer material pattern and the underlying target material to form a target material pattern comprising a pitch about one quarter of the pitch of the first photoresist pattern.

9. The method of claim 8, wherein forming a first photoresist pattern over a first hard mask material comprises forming the first photoresist pattern over a polysilicon material, a silicon oxide material, a silicon nitride material, a carbon-containing material, or a metal material.

10. The method of claim 8, wherein forming a first photoresist pattern comprises removing a portion of a first photoresist material overlying the second hard mask material.

11. The method of claim 8, wherein forming a second hard mask pattern on the first hard mask material comprises using the first photoresist pattern as a mask to form the second hard mask pattern.

12. The method of claim 8, wherein forming a second hard mask pattern on the first hard mask material comprises forming the second hard mask pattern comprising a second photoresist material.

13. The method of claim 8, wherein removing the second hard mask material exposed between the first spacers and the second spacers to form a spacer material pattern comprises forming the spacer material pattern comprising the first spacers and the second spacers.

14. The method of claim 8, wherein removing the first hard mask material exposed between the spacer material pattern and the underlying target material to form a target material pattern comprises forming the target material pattern in a dielectric material, a polysilicon material, or a metal material.

15. A method of patterning a target material, comprising:
   forming a first pattern over a first hard mask material on a target material;
   forming a second pattern over the first hard mask material, the second pattern aligned with the first pattern and comprising a second hard mask material;
   laterally removing a portion of the first pattern without laterally removing a portion of the second pattern to form trimmed features on the second pattern;

forming a spacer material over the trimmed features, the second pattern, and the first hard mask material;

removing a portion of the spacer material to form first spacers on sidewalls of the trimmed features and second spacers on sidewalls of the second pattern;

removing the trimmed features;

removing a portion of the second pattern exposed between the first spacers and the second spacers to form a spacer material pattern;

removing the first hard mask material exposed between the spacer material pattern to form a hard mask pattern; and removing the target material exposed between the hard mask pattern to form a pattern of lines in the target material.

16. The method of claim 15, wherein forming a first pattern over a first hard mask material on a target material comprises forming a pattern of lines over the first hard mask material.

17. The method of claim 16, wherein forming a first pattern over a first hard mask material on a target material comprises forming each of the lines of the first pattern at a first pitch.

18. The method of claim 17, wherein removing the first hard mask material exposed between the spacer material pattern to form a hard mask pattern comprises forming lines of the hard mask pattern at a second pitch equal to about one-quarter of the first pitch.

19. The method of claim 15, wherein forming a spacer material over the trimmed features, the second pattern, and the first hard mask material comprises conformally forming a silicon oxide material over the trimmed features, the second pattern, and the first hard mask material.

20. The method of claim 15, wherein removing the target material exposed between the hard mask pattern to form a pattern of lines in the target material comprises forming a pattern of equally-spaced lines in the target material.

\* \* \* \* \*